(12) United States Patent
Shin et al.

(10) Patent No.: US 9,153,793 B2
(45) Date of Patent: Oct. 6, 2015

(54) ORGANIC LIGHT-EMITTING DISPLAY APPARATUS AND METHOD OF MANUFACTURING THE SAME

(75) Inventors: Min-Chul Shin, Yongin (KR); Do-Young Kim, Yongin (KR); Yun-Gyu Lee, Yongin (KR); Jong-Moo Huh, Yongin (KR)

(73) Assignee: Samsung Display Co., Ltd., Samsung-ro, Giheung-Gu, Yongin-si, Gyeonggi-Do (KR)

(*) Notice: Subject to any disclaimer, the term of this patent is extended or adjusted under 35 U.S.C. 154(b) by 804 days.

(21) Appl. No.: 13/330,477

(22) Filed: Dec. 19, 2011

(65) Prior Publication Data
US 2012/0267629 A1     Oct. 25, 2012

(30) Foreign Application Priority Data
Apr. 19, 2011   (KR) .................. 10-2011-0036394

(51) Int. Cl.
*H01L 51/52*   (2006.01)
*H01L 27/32*   (2006.01)

(52) U.S. Cl.
CPC ........ *H01L 51/5271* (2013.01); *H01L 27/3244* (2013.01)

(58) Field of Classification Search
USPC ............. 257/40, 57, 59, 642–643, 759, 257/E51.001–E51.052, E25.008–E25.009
See application file for complete search history.

(56) References Cited

U.S. PATENT DOCUMENTS 6,822,264 B2 *  11/2004  Yamazaki et al. ............ 257/79
2005/0116620 A1   6/2005  Kobayashi

FOREIGN PATENT DOCUMENTS

| KR | 10-2004-0000629 | 1/2004 |
| KR | 10-2004-0037889 | 5/2004 |
| KR | 10-0691690 | 2/2007 |
| KR | 10-2007-0068092 | 6/2007 |
| KR | 10-0943187 | 2/2010 |

* cited by examiner

*Primary Examiner* — Mamadou Diallo
(74) *Attorney, Agent, or Firm* — Robert E. Bushnell, Esq.

(57) ABSTRACT

In an organic light-emitting display apparatus for improving image quality and a method of manufacturing the same, the organic light-emitting display apparatus comprises a substrate, a first electrode disposed on the substrate, an intermediate layer disposed on the first electrode and including an organic emission layer, a second electrode disposed on the intermediate layer, and a reflective unit disposed near the intermediate layer and reflecting visible light emitted from the intermediate layer.

24 Claims, 14 Drawing Sheets

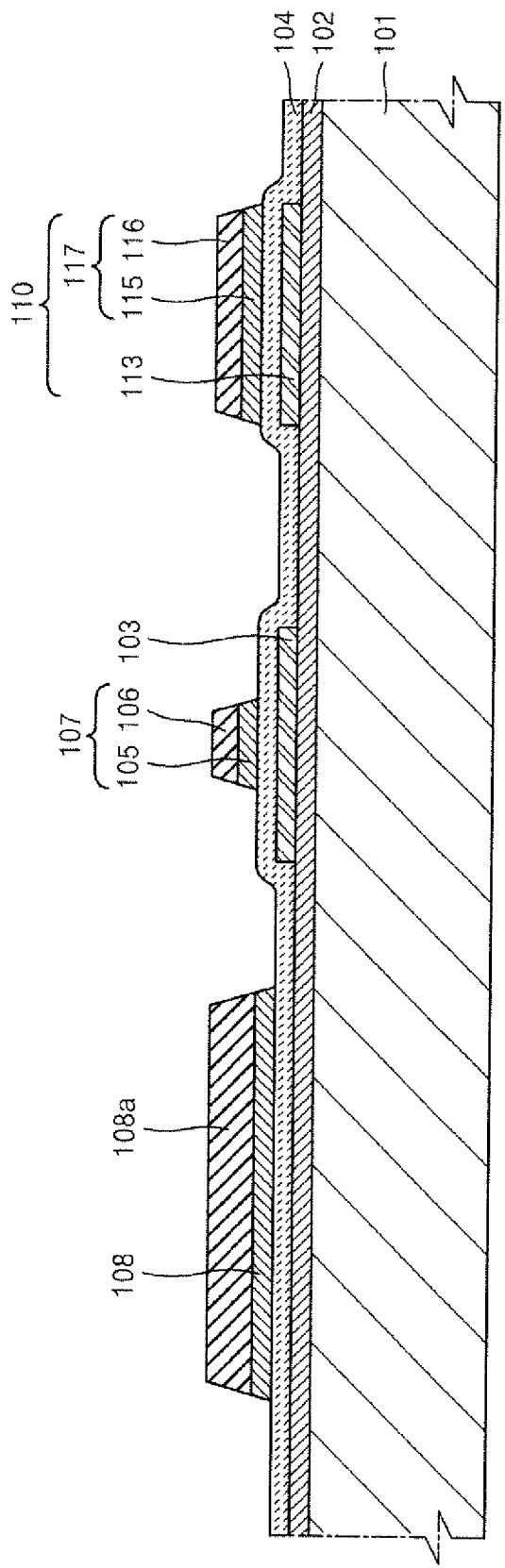

ORGANIC LIGHT-EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 19 Apr. 2011 and there duly assigned Serial No. 10-2011-0036394.

BACKGROUND OF THE INVENTION

1. Field of the Invention

The present invention relates to an organic light-emitting apparatus and a method of manufacturing the same and, more particularly, to an organic light-emitting apparatus for improving image quality and a method of manufacturing the same.

2. Description of the Related Art

Recently, display apparatuses have been replaced with thin-film type flat panel display apparatuses which are portable. From among thin-film type flat panel display apparatuses, an organic light-emitting display apparatus is a self-emitting display apparatus which has a larger viewing angle, better contrast characteristics, and a faster response rate, and thus it has drawn attention as a next-generation display device.

An organic light-emitting display apparatus comprises an intermediate layer, a first electrode, and a second electrode. The intermediate layer includes an organic emission layer. When voltage is applied to the first electrode and the second electrode, the organic emission layer emits visible light.

When a user views an image displayed on the organic light-emitting display apparatus by operating the organic light-emitting display apparatus, some of the visible light generated by the organic emission layer may travel in undesired directions, i.e., not toward the user.

Accordingly, the optical efficiency of the organic light-emitting display apparatus decreases and improvement of image quality is limited.

SUMMARY OF THE INVENTION

The present invention provides an organic light-emitting apparatus for improving image quality and a method of manufacturing the same.

According to an aspect of the present invention, an organic light-emitting display apparatus comprises a substrate, a first electrode disposed on the substrate, an intermediate layer disposed on the first electrode and including an organic emission layer, a second electrode disposed on the intermediate layer, and a reflective unit disposed near the intermediate layer for reflecting visible light emitting from the intermediate layer.

The reflective unit may be formed long so as to correspond to at least one side surface of the intermediate layer.

The reflective unit may wrap side surfaces of the intermediate layer.

A surface of the reflective unit facing the intermediate layer may be inclined.

The surface of the reflective unit facing the intermediate layer may form an acute angle with the substrate.

The reflective unit may taper from top to bottom.

The reflective unit may be formed below a layer on which the first electrode is disposed.

The organic light-emitting display apparatus may further include a thin-film transistor (TFT) which is disposed on the substrate and includes an active layer, a gate electrode, a source electrode, and a drain electrode, and which is electrically connected to the first electrode.

The reflective unit may be formed of the same material used to form the source electrode or the drain electrode.

The reflective unit may be disposed separate from the source electrode and the drain electrode.

The source electrode or the drain electrode may be connected to the first electrode. The reflective unit may be connected to the source electrode or the drain electrode, which is connected to the first electrode.

The organic light-emitting display apparatus may further include an interlayer insulating layer disposed between the gate electrode and the source electrode and between the gate electrode and the drain electrode. The interlayer insulating layer may expose a predetermined region of the first electrode, and the intermediate layer may be disposed on the exposed region of the first electrode. A through-hole may be formed in the interlayer insulating layer, and the reflective unit may be disposed in the through-hole.

A contact hole may be formed in the interlayer insulating layer. The source electrode or the drain electrode may be connected to the first electrode via the contact hole. The through-hole may be disposed separate from the contact hole.

The interlayer insulating layer may include a contact hole. The source electrode or the drain electrode may be connected to the first electrode via the contact hole. The through-hole may be connected to the contact hole.

The gate electrode and the first electrode may be disposed on the same layer.

The gate electrode may include a first conductive layer and a second conductive layer disposed on the first conductive layer. The first electrode may be formed of the same material used to form the first conductive layer.

The first conductive layer may include a transmissive conductive material.

The organic light-emitting display apparatus may further include a conductive unit disposed on a predetermined region of the first electrode. The conductive unit may be connected to the source electrode or the drain electrode, and may be formed of the same material used to form the second conductive layer.

According to another aspect of the present invention, a method of manufacturing an organic light-emitting display apparatus comprises forming a first electrode on a substrate, forming an intermediate layer on the first electrode, the immediate layer including an organic emission layer; forming a second electrode on the intermediate layer, and forming a reflective unit near the intermediate layer, the reflective unit reflecting visible light emitted from the intermediate layer.

The reflective unit, the source electrode, and the drain electrode may be simultaneously formed of the same material.

The method may further include forming a thin-film transistor (TFT) on the substrate, the TFT being electrically connected to the first electrode and including an active layer, a gate electrode, a source electrode, and a drain electrode.

The gate electrode may include a first conductive layer and a second conductive layer disposed on the first conductive layer. The first electrode may be formed of the same material used to form the first conductive layer. A conductive unit may be formed on the first electrode so as to be connected to the drain electrode, and may be of the same material used to form the second conductive layer. The source electrode, the drain electrode, and the reflective unit may be simultaneously patterned. A predetermined region of the conductive unit may be removed so as to expose an upper surface of the first electrode while the source electrode, the drain electrode, and the reflective unit are patterned.

The first electrode and the gate electrode may be patterned using one mask.

The gate electrode may include a first conductive layer and a second conductive layer formed on the first conductive layer. The first electrode may be formed of the same material used to form the first conductive layer. The forming of the gate electrode and the first electrode may include sequentially applying a material for forming the first conductive layer and a material for forming the second conductive layer without performing a patterning process thereon, and simultaneously patterning the gate electrode and the first electrode by using a halftone mask.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 7A through 7D are cross-sectional views sequentially illustrating a method of manufacturing an organic light-emitting display apparatus according to an embodiment of the present invention.

DETAILED DESCRIPTION OF THE INVENTION

Hereinafter, exemplary embodiments of the present invention will be described in detail with reference to the accompanying drawings.

Figure 1:
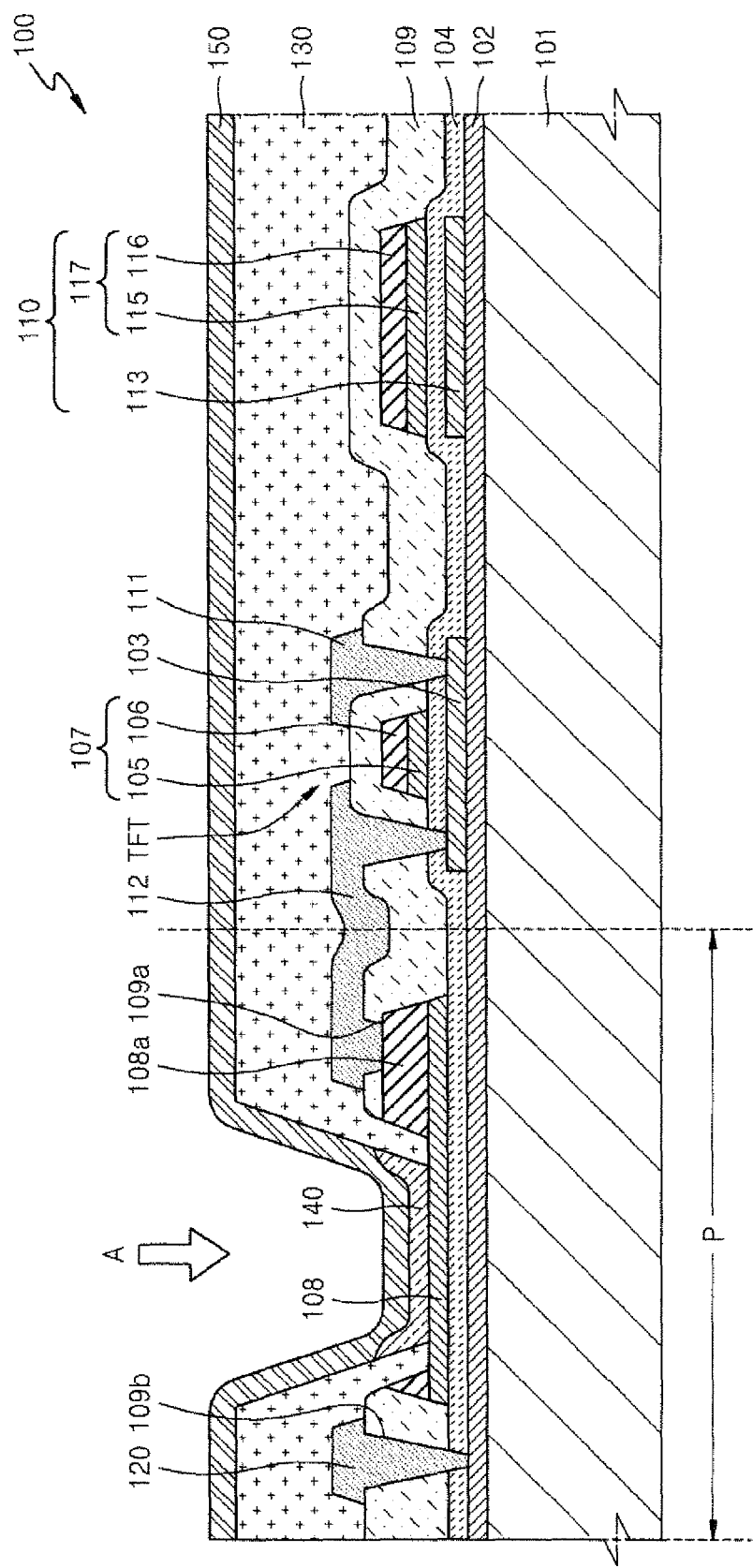
FIG. 1 is a schematic cross-sectional view of an organic light-emitting display apparatus according to an embodiment of the present invention.
Figure 2:
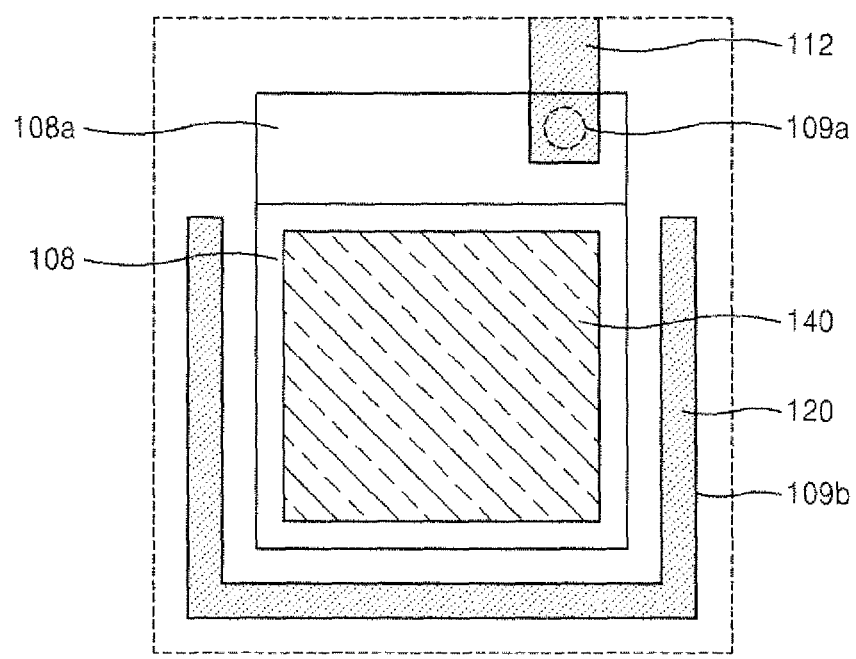
FIG. 2 is a partial plan view of a P region illustrated in FIG. 1, and viewed in an A direction.

FIG. 1 is a schematic cross-sectional view of an organic light-emitting display apparatus 100 according to an embodiment of the present invention, and FIG. 2 is a partial plan view of a P region illustrated in FIG. 1 and viewed in an A direction. For convenience of explanation, FIG. 2 illustrates only an intermediate layer 140, a first electrode 108, a conductive unit 108a, a reflective unit 120, a drain electrode 112, a contact hole 109a, and a through-hole 109b.

Referring to FIGS. 1 and 2, the organic light-emitting display apparatus 100 largely comprises a substrate 101, a thin-film transistor (TFT), first electrode 108, intermediate layer 140, a second electrode 150, reflective unit 120, and a capacitor 110.

The TFT includes an active layer 103, a gate electrode 107, a source electrode 111, and a drain electrode 112. The capacitor 110 includes a first capacitor electrode 113 and a second capacitor electrode 117.

These elements will now be described in detail.

The substrate 101 may be formed of a $SiO_2$-based transparent glass material but is not limited thereto, and may be formed of any transparent plastic material. The transparent plastic material may include at least one material selected from among various organic materials.

A buffer layer 102 is formed on the substrate 101. The buffer layer 102 may contain $SiO_2$ or $SiN_x$. The buffer layer 102 provides a flat surface on the substrate 101, and prevents moisture or foreign substances from penetrating the substrate 101.

The active layer 103 and the first capacitor electrode 113 are formed on the buffer layer 102. The active layer 103 and the first capacitor electrode 113 may be formed of the same material. The active layer 103 and the first capacitor electrode 113 each contain a semiconductor material, e.g., an amorphous or polycrystalline silicon material.

A gate insulating layer 104 is formed on the buffer layer 102 so as to cover the active layer 103 and the first capacitor electrode 113.

The gate electrode 107, the first electrode 108, and the second capacitor electrode 117 are formed on the gate insulating layer 104.

The gate electrode 107 includes a first conductive layer 105 and a second conductive layer 106. The first conductive layer 105 contains a transmissive conductive material, e.g., indium tin oxide (ITO).

The second conductive layer 106 may be formed on the first conductive layer 105 by using at least one material selected from the group consisting of molybdenum (Mo), molybdenum-tungsten (MoW), and aluminum (Al)-based alloy, but the second conductive layer 106 is not limited thereto.

The first electrode 108 contains a transmissive conductive material, and may be formed of, for example, the same material used to form the first conductive layer 105. The conductive unit 108a is disposed on a predetermined region of the first electrode 108, and is formed of the same material used to form the second conductive layer 106.

The second capacitor electrode 117 includes a first layer 115 and a second layer 116. The first layer 115 may be respectively formed of the same material used to form the first conductive layer 105, and the second layer 106 may be formed of the same material used to form the second conductive layer 106.

An interlayer insulating layer 109 is formed on the first electrode 108, the gate electrode 107, and the second capacitor electrode 117. The interlayer insulating layer 109 may contain at least one of various insulating materials, such as an organic material and an inorganic material.

The source electrode 111, the drain electrode 112, and the reflective unit 120 are formed on the interlayer insulating layer 109. The source electrode 111 and the drain electrode 112 are formed so as to be connected to the active layer 103. The source electrode 111 and the drain electrode 112 may each be formed of at least one of various insulating materials, e.g., the group consisting of gold (Au), palladium (Pd), platinum (Pt), nickel (Ni), rhodium (Rh), ruthenium (Ru), iridium (Ir), osmium (Os), Al, Mo, neodymium (Nd), Mo, and W, but the source electrode 111 and the drain electrode 112 are not limited thereto.

The source electrode 111 or the drain electrode 112 is electrically connected to the first electrode 108. FIGS. 1 and 2 illustrate that, for example, the drain electrode 112 is electrically connected to the first electrode 108. In detail, the interlayer insulating layer 109 includes the contact hole 109a, and the drain electrode 112 contacts the conductive unit 108a via the contact hole 109a.

A pixel defining layer 130 is formed on the interlayer insulating layer 109 so as to cover the TFT and the capacitor 110. The pixel defining layer 130 exposes an upper region of the first electrode 108, and the intermediate layer 140 is formed so as to contact the first electrode 108. The intermediate layer 140 includes an organic emission layer (not shown).

The reflective unit 120 is formed near the intermediate layer 140. Specifically, the reflective unit 120 is formed in the through-hole 109b in the interlayer insulating layer 109. The reflective unit 120 may be formed of at least one of various reflective materials, e.g., the same material used to form the source electrode 111 and the drain electrode 112.

A surface of the reflective unit 120, which faces the intermediate layer 140, is inclined. Specifically, the surface of the reflective unit 120 facing the intermediate layer 140 tapers from top to bottom. That is, the surface of the reflective unit 120 facing the intermediate layer 140 forms an acute angle with the substrate 101.

To this end, the reflective unit 120 may be formed in one of various shapes. For example, the reflective unit 120 may taper from top to bottom. That is, the greater the distance between the reflective unit 120 and the substrate 101, the greater the width of the reflective unit 120 may be.

Accordingly, some of visible light emitted from the intermediate layer 140, which travels toward side surfaces of the intermediate layer 140, is reflected from the reflective unit 120 so as to travel toward the user. In particular, since the reflective unit 120 has the inclined surface, most of the light incident on the reflective unit 120 travels downward and toward the substrate 101.

The reflective unit 120 is formed long so as to correspond to at least one of the side surfaces of the intermediate layer 140. In detail, the reflective unit 120 may be formed long so as to correspond to three side surfaces of the intermediate layer 140, as illustrated in FIG. 2.

However, the present invention is not limited to the above description. For example, a sufficient space between the conductive unit 108a and the intermediate layer 140 on the first electrode 108 may be secured, and the reflective unit 120 may be formed long in the space so as to correspond to at least one side surface of the intermediate layer 140 between the conductive unit 108a and the intermediate layer 140.

The reflective unit 120 contacts the buffer layer 102, but the present invention is not limited thereto, and the reflective unit 120 may contact the substrate 101 when the buffer layer 102 is not formed. Thus, the reflective unit 120 is present below the intermediate layer 140, and some of the visible light emitted from the intermediate layer 140, which travels toward side surfaces of the intermediate layer 140, may be prevented from leaking, and may be effectively reflected from the reflective unit 120. In this case, since the reflective unit 120 is disposed below the first electrode 108, optical loss may be effectively prevented.

In the current embodiment, the reflective unit 120 is formed of the same material used to form the source electrode 111 or the drain electrode 112, but the present invention is not limited thereto, and the reflective unit 120 may be formed of the same material used to form the gate electrode 107. In this case, interlayer insulating layer 109 may be formed on the reflective unit 120 and the through-hole 109b may not be formed.

The second electrode 150 is formed on the intermediate layer 140. If voltage is applied to the first electrode 108 and the second electrode 150, visible light is emitted from the organic emission layer on the intermediate layer 140.

A sealing unit (not shown) may be disposed on the second electrode 150. The sealing unit protects the intermediate layer 140 or other layers from moisture or oxygen, and is formed of a transparent material. The sealing unit may be formed of at least one of various materials, e.g., glass, plastic, an organic material, an inorganic material, or a stacked structure of an organic material and an inorganic material.

In the organic light-emitting display apparatus 100 according to the current embodiment, the reflective layer 120 is formed so as to correspond to at least one surface of the intermediate layer 140. Some of the visible light emitted from the intermediate layer 140, which travels toward side surfaces of the intermediate layer 140, is reflected from the reflective unit 120. The reflected light travels toward the user, and the optical efficiency of the organic light-emitting display apparatus 100 is thus improved, thereby enhancing image quality.

In particular, since a surface of the reflective unit 120 facing the intermediate layer 140 tapers from top to bottom, the visible light reflected from the reflective unit 120 travels downward and toward the substrate 101. Thus, if the organic light-emitting display apparatus 100 is a bottom emission type, in which a user views an image in a direction toward a lower portion of the substrate 101, then image quality may be greatly enhanced.

The reflective unit 120 may be formed of the same material used to form the source electrode 111 and the drain electrode 112, thereby facilitating the manufacturing process. Also, the reflective unit 120 may be formed on the interlayer insulating layer 109, on which the source electrode 111 and the drain electrode 112 are disposed, without having to increase the thickness of the organic light-emitting display apparatus 100.

Figure 3:
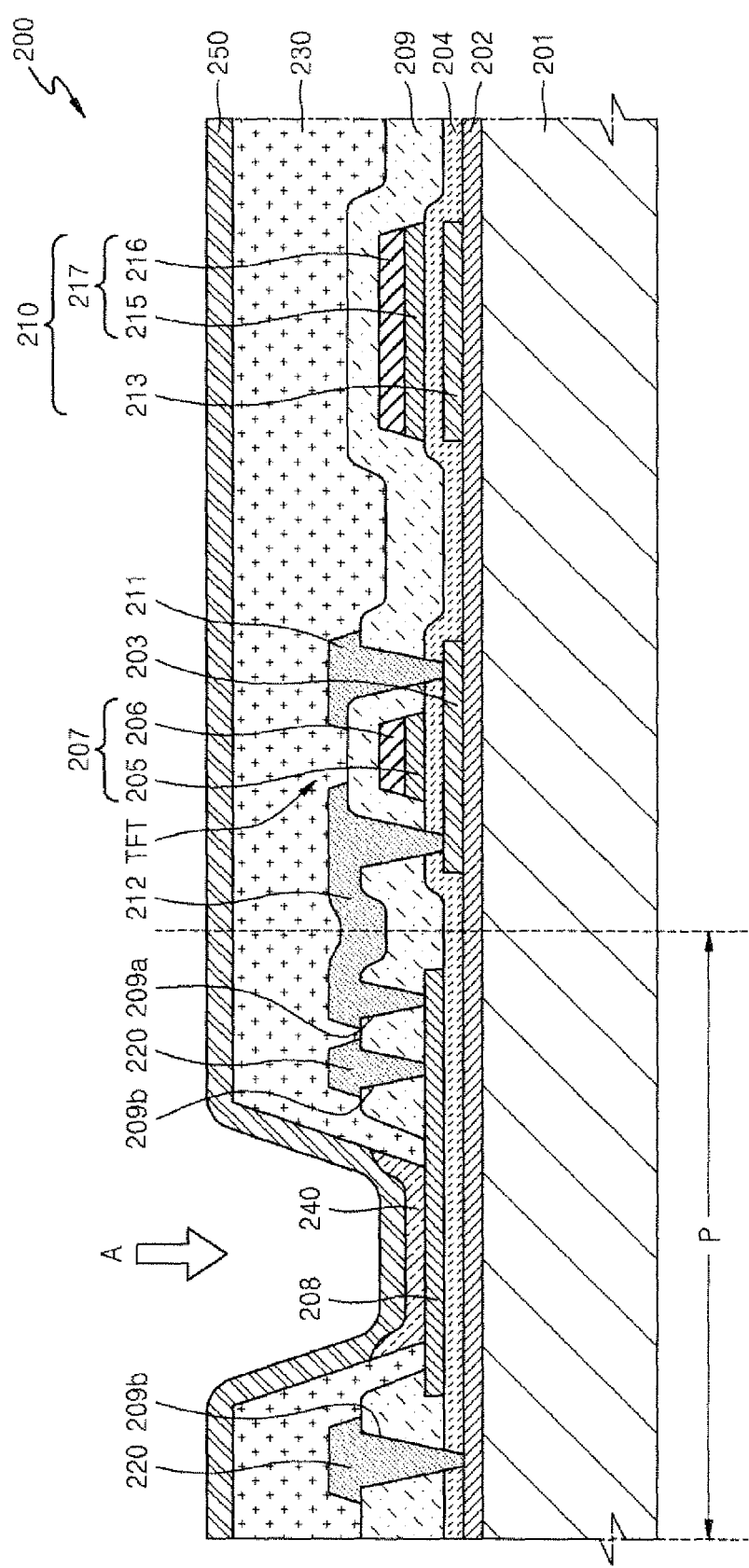
FIG. 3 is a schematic cross-sectional view of an organic light-emitting display apparatus according to another embodiment of the present invention.
Figure 4:
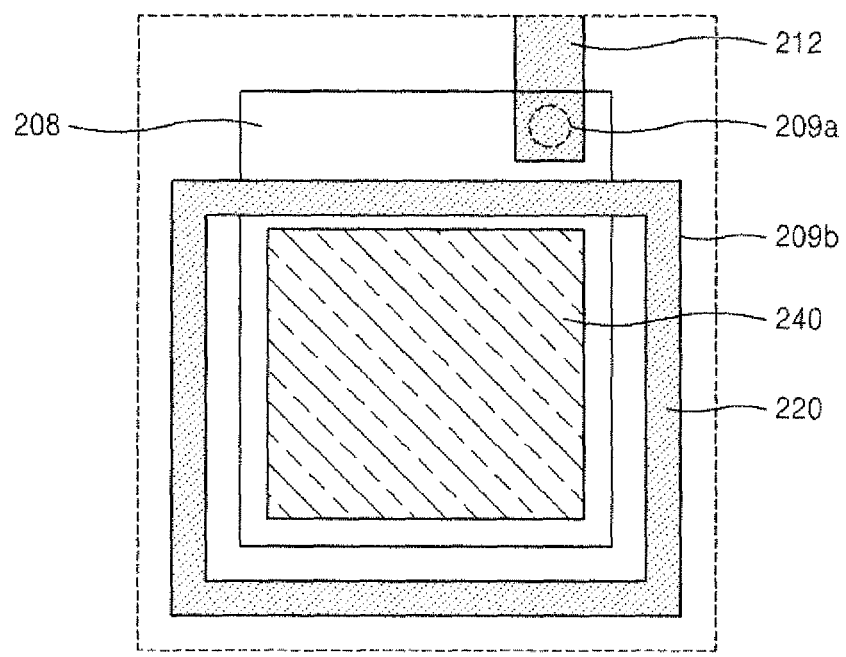
FIG. 4 is a partial plan view of a P region illustrated in FIG. 3, and viewed in an A direction.

FIG. 3 is a schematic cross-sectional view of an organic light-emitting display apparatus 200 according to another embodiment of the present invention, and FIG. 4 is a partial plan view of a P region illustrated in FIG. 3 and viewed in an A direction. For convenience of explanation, the current embodiment of FIGS. 3 and 4 will be described by focusing on the differences between the current embodiment and the previous embodiment of FIGS. 1 and 2.

For convenience of explanation, FIG. 4 illustrates only an intermediate layer 240, a first electrode 208, a reflective unit 220, a drain electrode 212, a contact hole 209a, and a through-hole 209b.

Referring to FIGS. 3 and 4, the organic light-emitting display apparatus 200 largely comprises a substrate 201, a TFT, first electrode 208, intermediate layer 240, a second electrode 250, reflective unit 220, and a capacitor 210.

The TFT includes an active layer 203, a gate electrode 207, a source electrode 211, and a drain electrode 212. The capacitor 210 includes a first capacitor electrode 213 and a second capacitor electrode 217.

A buffer layer 202 is formed on the substrate 201, and the active layer 203 and the first capacitor electrode 213 are formed on the buffer layer 202. A gate insulating layer 204 is formed on the buffer layer 202 so as to cover the active layer 203 and the first capacitor electrode 213.

The gate electrode 207, the first electrode 208, and the second capacitor electrode 217 are formed on the gate insulating layer 204. The gate electrode 207 includes a first conductive layer 205 and a second conductive layer 206. The second capacitor electrode 217 includes a first layer 215 and a second layer 216. The first layer 215 is formed of the same material used to form the first conductive layer 205, and the second layer 216 is formed of the same material used to form the second conductive layer 206.

The first electrode 208 contains a transmissive conductive material, e.g., the same material used to form the first conductive layer 205.

An interlayer insulating layer 209 is formed on the first electrode 208, the gate electrode 207, and the second capacitor electrode 217. The source electrode 211, the drain electrode 212, and the reflective unit 220 are formed on the interlayer insulating layer 209.

The interlayer insulating layer 209 has a contact hole 209a, and the drain electrode 212 contacts the first electrode 208 via the contact hole 209a.

A pixel defining layer 230 is formed on the interlayer insulating layer 209 so as to cover the TFT and the capacitor 210. The pixel defining layer 230 exposes an upper region of the first electrode 208, and the intermediate layer 240 contacts the first electrode 208. The intermediate layer 240 includes an organic emission layer (not shown).

The reflective unit 220 is disposed near the intermediate layer 240. In detail, the reflective unit 220 is formed in through-hole 209b in the interlayer insulating layer 209.

The reflective unit 220 is formed long so as to correspond to at least one side surface of the intermediate layer 240. In detail, the reflective unit 220 may be formed long so as to correspond to all side surfaces of the intermediate layer 240, as illustrated in FIG. 4. That is, the reflective unit 220 may wrap around all of the side surfaces of the intermediate layer 240.

In this case, the reflective unit 220 is disposed separate from the source electrode 211 and the drain electrode 212. That is, as illustrated in FIG. 2, the through-hole 209b and the contact hole 209a are not connected to each other. If the reflective unit 220 is separated from the source electrode 211 and the drain electrode 212, current does not flow through the reflective unit 220 via the source electrode 211 and the drain electrode 212. Accordingly, it is possible to prevent abnormal light emission, caused by uneven flow of current therethrough, from occurring in the intermediate layer 240.

However, the present invention is not limited to the above description, and the structures of the reflective unit 220, the source electrode 211, and the drain electrode 212 may vary according to manufacturing conditions, as will be described below in another embodiment of the present invention.

In the current embodiment, the reflective unit 220 is formed of the same material used to form the source electrode 211 or the drain electrode 212, but the present invention is not limited thereto and the reflective unit 220 may be formed of the same material used to form the gate electrode 207. In this case, the interlayer insulating layer 209 may be formed on the reflective unit 220 and the through-hole 209b may not be formed.

The second electrode 250 is formed on the intermediate layer 240. If voltage is applied to the first electrode 208 and the second electrode 250, visible light is emitted from the organic emission layer of the intermediate layer 240.

A sealing unit (not shown) may be disposed on the second electrode 250.

In the organic light-emitting display apparatus 200 according to the current embodiment, the reflective unit 220 is formed so as to correspond to at least one side surface of the intermediate layer 240. Thus, the optical efficiency of the organic light-emitting display apparatus 200 may be enhanced, thereby improving image quality. In particular, since the reflective unit 220 is formed so as to correspond to all side surfaces of the intermediate layer 240 (i.e., wrapping around all side surfaces of the intermediate layer 240), the amount of light emitted from the reflective unit 220 increases, and the optical efficiency of the organic light-emitting display apparatus 200 may be greatly enhanced, thereby improving image quality.

Figure 5:
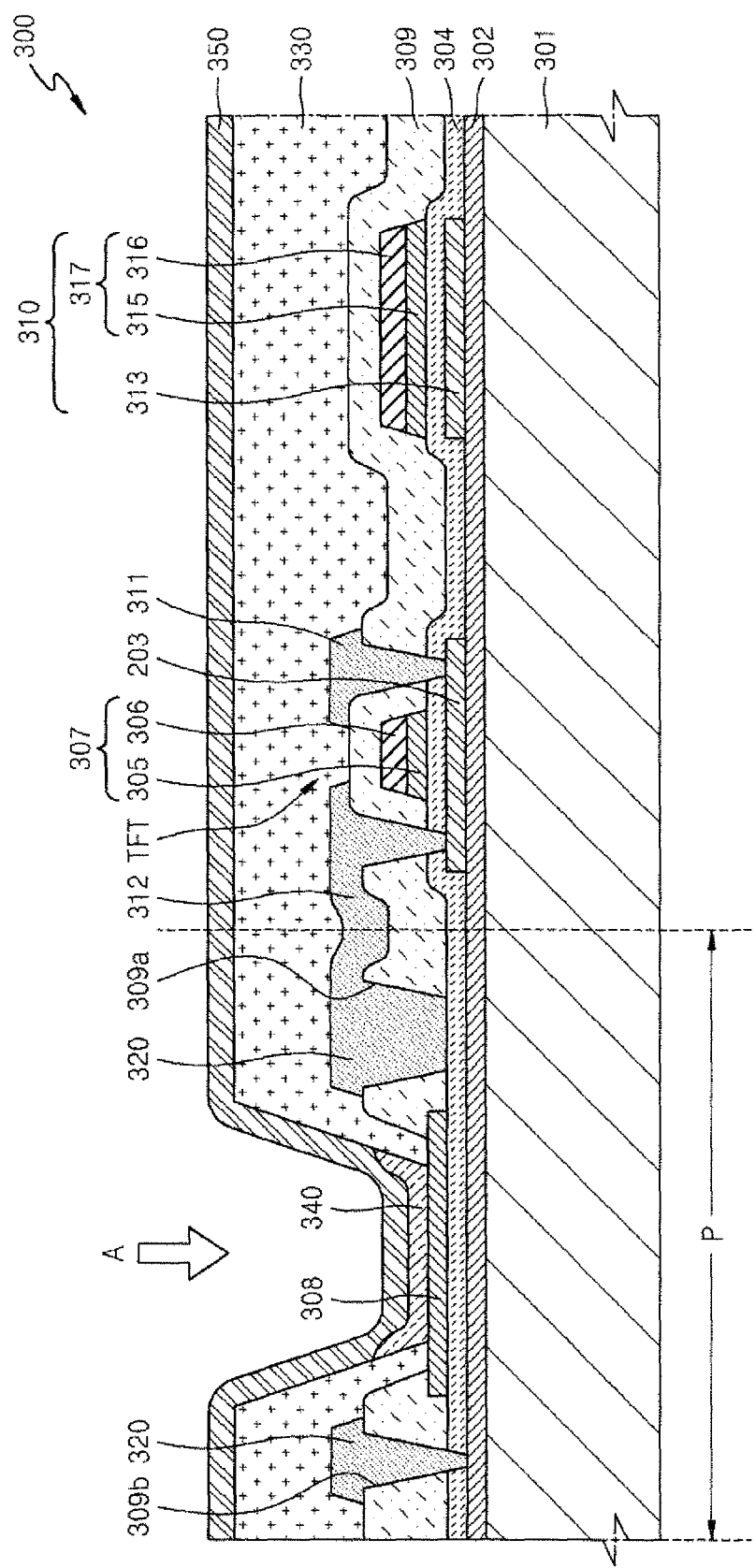
FIG. 5 is a schematic cross-sectional view of an organic light-emitting display apparatus according to another embodiment of the present invention.
Figure 6:
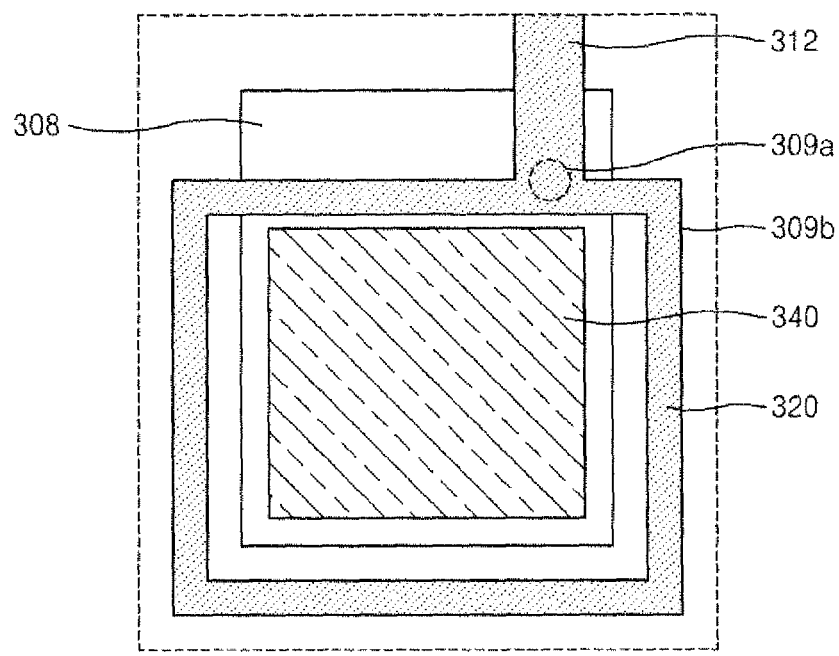
FIG. 6 is a partial plan view of a P region illustrated in FIG. 5, and viewed in an A direction.

FIG. 5 is a schematic cross-sectional view of an organic light-emitting display apparatus 300 according to another embodiment of the present invention, and FIG. 6 is a partial plan view of a P region illustrated in FIG. 5 and viewed in an A direction. For convenience of explanation, the current embodiment will be described by focusing on the differences between the current embodiment and the previous embodiments.

For convenience of explanation, FIG. 6 illustrates only an intermediate layer 340, a first electrode 308, a reflective unit 320, a drain electrode 312, a contact hole 309a, and a through-hole 309b.

Referring to FIGS. 5 and 6, the organic light-emitting display apparatus 300 largely comprises a substrate 301, a TFT, first electrode 308, intermediate layer 340, a second electrode 350, reflective unit 320, and a capacitor 310.

The TFT includes an active layer 303, a gate electrode 307, a source electrode 311, and a drain electrode 312. The capacitor 310 includes a first capacitor electrode 313 and a second capacitor electrode 317.

The gate electrode 307 includes a first conductive layer 305 and a second conductive layer 306. The second capacitor electrode 317 includes a first layer 315 and a second layer 316. The first layer 315 is formed of the same material used to form the first conductive layer 305, and the second layer 316 is formed of the same material used to form the second conductive layer 206.

An interlayer insulating layer 309 is formed on the first electrode 308, the gate electrode 307, and the second capacitor electrode 317. A source electrode 311, a drain electrode 312, and a reflective unit 320 are formed on the interlayer insulating layer 309.

The interlayer insulating layer 309 has a contact hole 309a, and the drain electrode 312 contacts the first electrode 308 via the contact hole 309a.

A pixel defining layer 330 is formed on the interlayer insulating layer 309 so as to cover the TFT and the capacitor 310. The pixel defining layer 330 exposes an upper region of the first electrode 308, and the intermediate layer 340 contacts the first electrode 308. The intermediate layer 340 includes an organic emission layer (not shown).

The reflective unit 320 is disposed near the intermediate layer 340. In detail, the reflective unit 320 is formed in the through-hole 309b in the interlayer insulating layer 309.

The reflective unit 320 is formed long so as to correspond to at least one side surface of the intermediate layer 340. In detail, the reflective unit 320 may be formed long so as to correspond to all side surfaces of the intermediate layer 340, i.e., wrapping around the side surfaces of the intermediate layer 340, as illustrated in FIG. 6.

In this case, the reflective unit 320 is connected to the source electrode 311 or the drain electrode 312, which is connected to the first electrode 308. In the current embodiment, the reflective unit 320 is connected to the drain electrode 312. That is, the through-hole 309b and the contact hole 309a are connected to each other, as illustrated in FIG. 6.

The second electrode 350 is formed on the intermediate layer 340. A sealing unit (not shown) may be disposed on the second electrode 350.

In the organic light-emitting display apparatus 300, the reflective unit 320 is formed so as to correspond to a side surface of the intermediate layer 340. Thus, the optical efficiency of the organic light-emitting display apparatus 300 is enhanced, thereby improving image quality. In particular, the reflective unit 320 is formed so as to correspond to all of the side surfaces of the intermediate layer 340, that is, wrapping around the side surfaces of the intermediate layer 340, thereby increasing the amount of light reflected from the reflective unit 320 so as to improve image quality.

Also, the through-hole 309b and the contact hole 309a are connected to each other so as to connect the reflective unit 320 to the drain electrode 312, thereby securing a space for receiving the reflective unit 320. Thus, the size of the intermediate layer 340 increases, thereby increasing an aperture ratio of the organic light-emitting display apparatus 300, and image quality may be improved accordingly.

FIGS. 7A through 7D are cross-sectional views sequentially illustrating a method of manufacturing an organic light-emitting display apparatus according to an embodiment of the present invention. In detail, FIGS. 7A through 7D illustrate a method of manufacturing the organic light-emitting display apparatus 100 of FIGS. 1 and 2. For convenience of explanation, the material used to form each element, and the structure of each element in the previous embodiments described above, will not be described again.

Referring to FIGS. 1 and 7A, the active layer 103, the capacitor 110, the gate electrode 107, and the first electrode 108 are formed on the substrate 101.

More specifically, the buffer layer 102 is formed on the substrate 101, and the active layer 103 and the first capacitor electrode 113 are formed on the buffer layer 102. The active layer 103 and the first capacitor electrode 113 may be simultaneously formed of the same material and according to a patterning process. Next, the gate insulating layer 104 is formed so as to cover the active layer 103 and the first capacitor electrode 113, and the gate electrode 107, the first electrode 108, and the second capacitor electrode 117 are formed on the gate insulating layer 104.

The gate electrode 107 includes the first conductive layer 105 and the second conductive layer 106. The first electrode 108 is formed of the material used to form the first conductive layer 105. The conductive unit 108a is formed on the first electrode 108 and by using the material used to form the second conductive layer 106.

The second capacitor electrode 117 includes the first layer 115 and the second layer 116. The first layer 115 is formed of the material used to form the first conductive layer 105, and the second layer 116 is formed of the material used to form the second conductive layer 106.

The first electrode 108, the conductive unit 108a, the gate electrode 107, and the second capacitor electrode 117 are simultaneously formed. That is, they are simultaneously formed by using one mask and according to one patterning process.

Figure 7B:
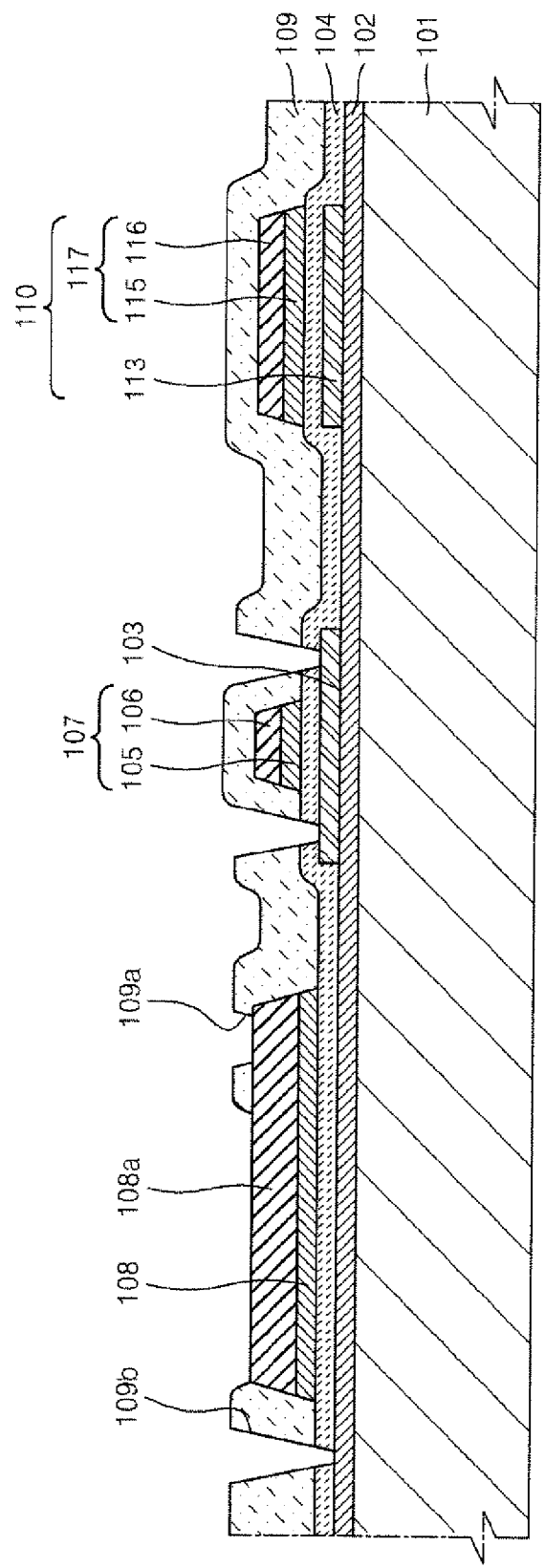

Then, referring to FIG. 7B, the interlayer insulating layer 109 is formed. In detail, the interlayer insulating layer 109 is formed on the gate insulating layer 104 so as to cover the gate electrode 107 and the second capacitor electrode 117, and so as to expose a predetermined region of the conductive unit 108a.

When the interlayer insulating layer 109 is formed, a predetermined region of the active layer 103 (i.e., source and drain regions (not shown) of the active layer 103) are also exposed. The interlayer insulating layer 109 has contact hole 109a for exposing the predetermined region of the conductive unit 108a so as to contact the drain electrode 112 which will be formed in a subsequent process, and has through-hole 109b formed long so as to receive the reflective unit 120 which will be formed in a subsequent process. The through-hole 109b may expose the buffer layer 102.

The through-hole 109b includes inclined surfaces. Specifically, a surface of the through-hole 109b, which faces the intermediate layer 140 so as to be formed on the first electrode 108, tapers from top to bottom. In other words, the surface of the through-hole 109b facing the intermediate layer 140 forms an acute angle with the substrate 101.

To this end, the through-hole 109b may be formed in one of various shapes. For example, the through-hole 109b may be tapered from top to bottom, that is, the greater the distance between the through-hole 109b and the substrate 101, the greater the width of the through-hole 109b may be.

In this case, the through-hole 109b is disposed separate from the contact hole 109a, and the through-hole 109b is disposed separate from the conductive unit 108a.

Figure 7C:
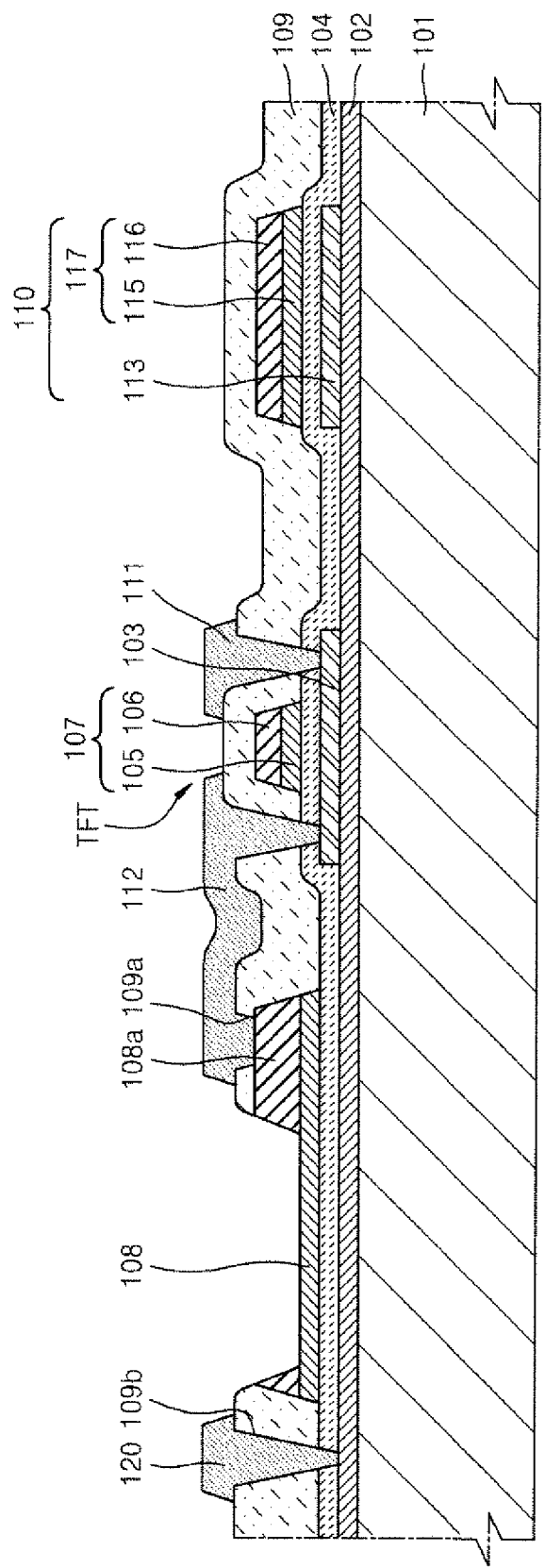

Next, referring to FIG. 7C, the TFT is obtained by forming the source electrode 111 and the drain electrode 112 on the interlayer insulating layer 109, and the reflective unit 120 is formed.

The source electrode 111 and the drain electrode 112 are formed so as to be connected to the source and drain regions, respectively, of the active layer 103. Specifically, the drain electrode 112 is electrically connected to the first electrode 108, and particularly so as to correspond to the contact hole 109a, and so as to contact the conductive unit 108a.

The reflective unit 120 is formed so as to correspond to the through-hole 109b. The reflective unit 120 is formed simultaneously with the source electrode 111 and the drain electrode 112. That is, the reflective unit 120, the source electrode 111, and the drain electrode 112 are simultaneously formed according to one patterning process.

During the patterning process of forming the reflective unit 120, the source electrode 111, and the drain electrode 112, a predetermined region of the conductive unit 108a is removed so as to expose the first electrode 108. That is, during the patterning process of forming the reflective unit 120, the source electrode 111, and the drain electrode 112, the predetermined region of the conductive unit 108a (illustrated in FIG. 7B), which is exposed and is not covered with the interlayer insulating layer 109, is removed.

Figure 7D:
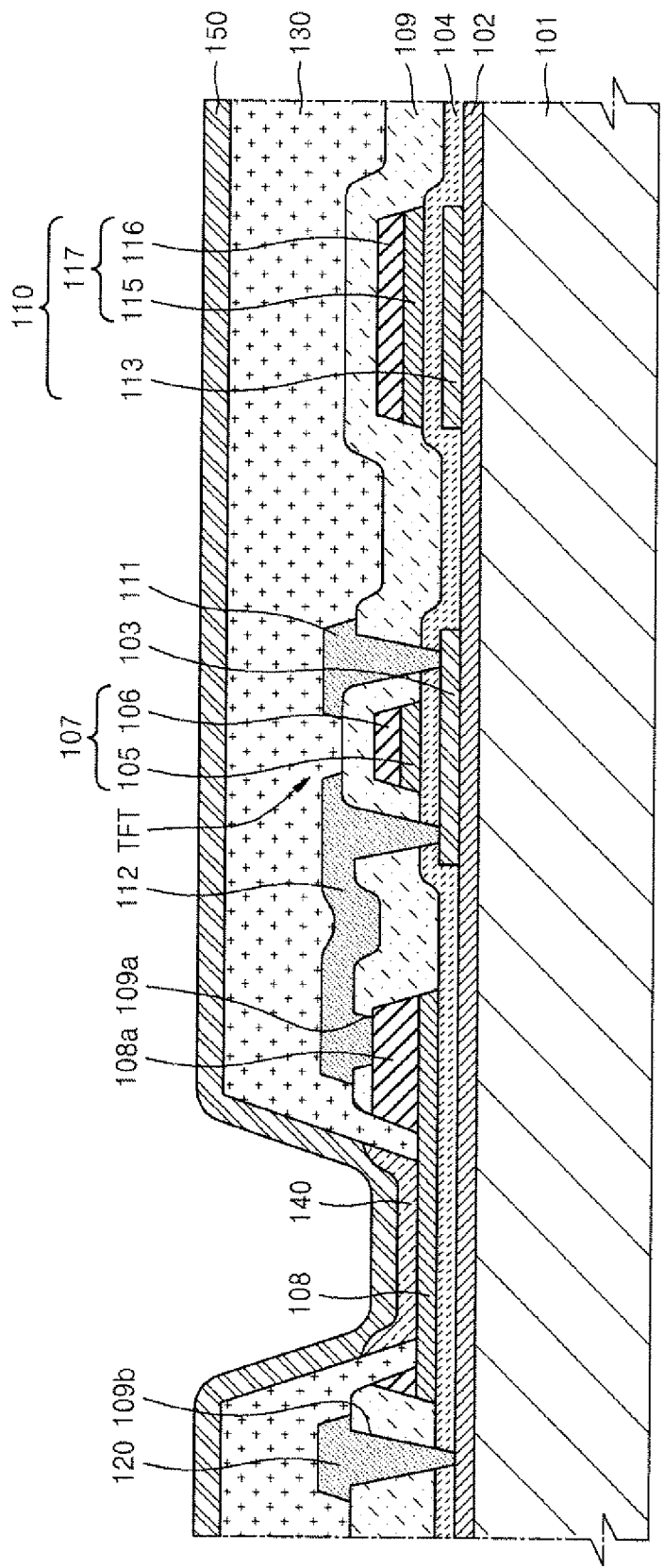

Then, Referring to FIG. 7D, the intermediate layer 140 and the second electrode 150 are formed so as to obtain, for example, the organic light-emitting display apparatus 100.

Specifically, the pixel defining layer 130 is formed on the interlayer insulating layer 109 so as to cover the TFT and the capacitor 110. The pixel defining layer 130 exposes an upper region of the first electrode 108. The intermediate layer 140 is formed so as to contact the first electrode 108. The intermediate layer 140 includes an organic emission layer (not shown).

The second electrode 150 is formed on the intermediate layer 140. If voltage is applied to the first electrode 108 and the second electrode 150, visible light is emitted from the organic emission layer of the intermediate layer 140.

A sealing unit (not shown) may be disposed on the second electrode 150.

In the organic light-emitting display apparatus 100 according to the current embodiment, the reflective unit 120 is included, and the reflective unit 120 is formed simultaneously with the source electrode 111 and the drain electrode 112, thereby facilitating the manufacturing process of the organic light-emitting display apparatus 100, enhancing the optical efficiency of the organic light-emitting display apparatus 100, and increasing image quality.

FIGS. 8A through 8D are cross-sectional views sequentially illustrating a method of manufacturing an organic light-emitting display apparatus according to another embodiment of the present invention. In detail, FIGS. 8A through 8D illustrate a method of manufacturing the organic light-emitting display apparatus 200 of FIGS. 3 and 4. For convenience of explanation, the material used to form each element and the structure of each element in the previous embodiments described above will not be described again.

Figure 8A:
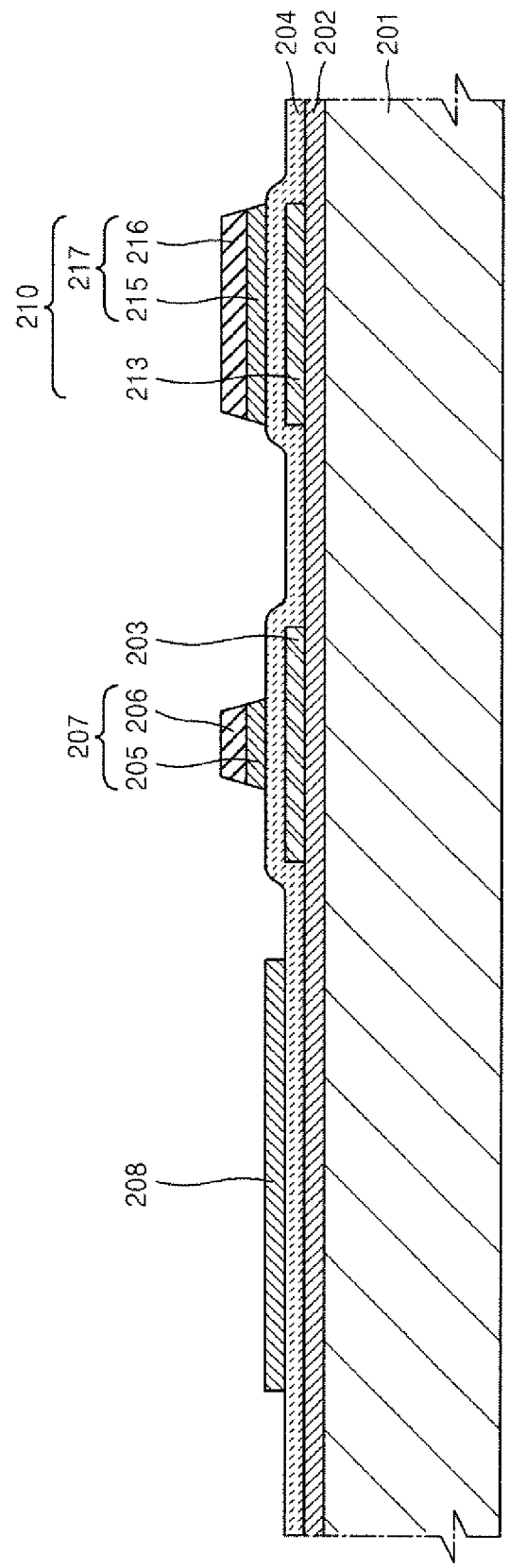
FIGS. 8A through 8D are cross-sectional views sequentially illustrating a method of manufacturing an organic light-emitting display apparatus according to another embodiment of the present invention.

Referring to FIGS. 3 and 8A, the active layer 203, the capacitor 210, the gate electrode 207, and the first electrode 208 are formed on the substrate 201.

Specifically, the buffer layer 202 is formed on the substrate 201, and the active layer 203 and the first capacitor electrode 213 are formed on the buffer layer 202. The active layer 203 and the first capacitor electrode 213 may be simultaneously formed of the same material and according to one patterning process. Then, the gate insulating layer 204 is formed so as to cover the active layer 203 and the first capacitor electrode 213, and the gate electrode 207, the first electrode 208, and the second capacitor electrode 217 are formed on the gate insulating layer 204.

The gate electrode 207 includes the first conductive layer 205 and the second conductive layer 206. The first electrode 208 is formed of the same material used to form the first conductive layer 205. The second capacitor electrode 217 includes the first layer 215 and the second layer 216. The first layer 215 is formed of the same material used to form the first conductive layer 205. The second layer 216 is formed of the same material used to form the second conductive layer 206.

The first electrode 208, the gate electrode 207, and the second capacitor electrode 217 are simultaneously formed. That is, they are simultaneously formed by using one mask and according to one patterning process.

The patterning process for forming the first electrode 208, the gate electrode 207, and the second capacitor electrode 217 will now be described in detail. First, a material for forming the first conductive layer 205 and a material for forming the second conductive layer 206 are sequentially applied onto the gate insulating layer 204 without performing the pattering process. Then, the first electrode 208, the gate electrode 207, and the second capacitor electrode 217 are simultaneously formed by using a halftone mask and performing the pattering process once.

Figure 8B:
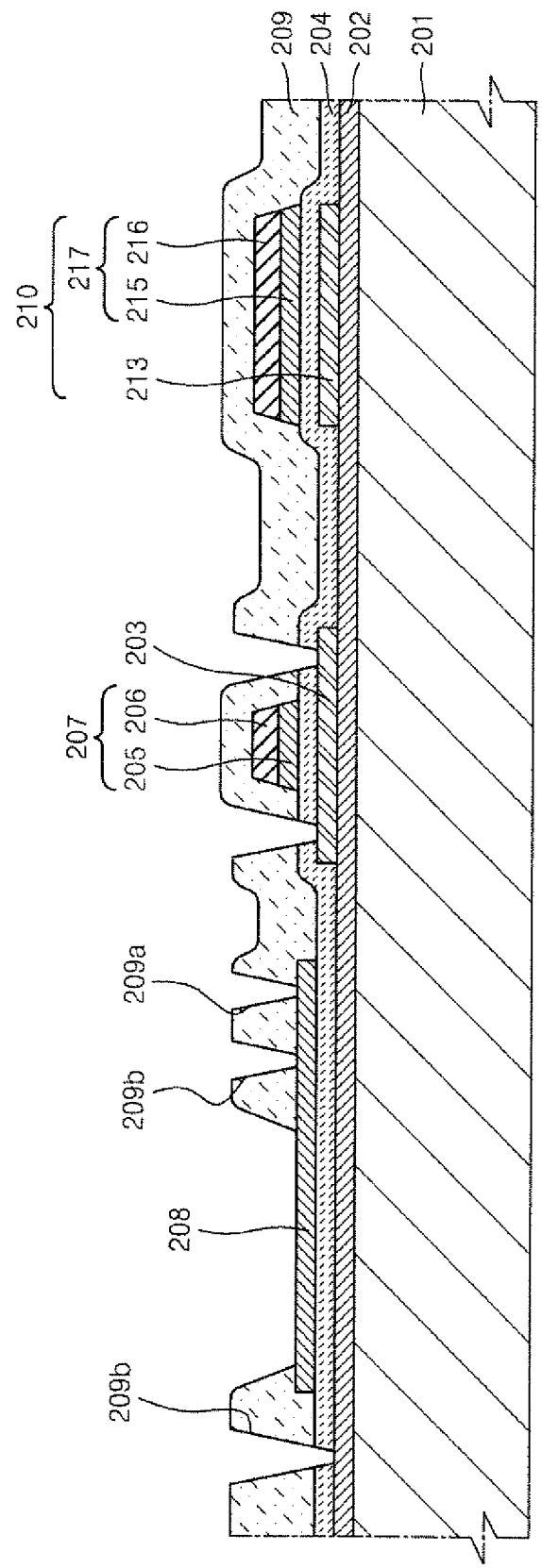

Next, referring to FIG. 8B, the interlayer insulating layer 209 is formed. In detail, the interlayer insulating layer 209 is formed on the gate insulating layer 204 so as to cover the gate electrode 207 and the second capacitor electrode 217, and so as to expose a predetermined region of the first electrode 208 so that the first electrode 208 may contact the intermediate layer 240 which will be formed in a subsequent process.

Also, the interlayer insulating layer 209 is formed so as to expose a predetermined region of the active layer 203, i.e., source and drain regions (not shown) of the active layer 203. The interlayer insulating layer 209 includes the contact hole 209a for exposing a predetermined region of the first electrode 208 so as to contact the drain electrode 212 which will be formed in a subsequent process, and also includes the through-hole 209b which is formed long for receiving the reflective unit 220 which will be formed in a subsequent process. The through-hole 209b may expose the buffer layer 202.

The through-hole 209b is not connected to, and is disposed separate from, the contact hole 209a, but the present invention is not limited thereto and may be formed so as to be connected to the through-hole 309b and the contact hole 309a as illustrated in FIGS. 5 and 6.

The through-hole 209b has inclined side surfaces. Specifically, a surface of the through-hole 209b, facing the intermediate layer 240 so as to be formed on the first electrode 208, is tapered from top to bottom. In other words, the surface of the through-hole 209b facing the intermediate layer 240 forms an acute angle with the substrate 201.

To this end, the through-hole 209b may be formed in one of various shapes. For example, the through-hole 209b may be tapered from top to bottom. That is, the greater the distance between the through-hole 209b and the substrate 201, the greater the width of the through-hole 209b may be.

Figure 8C:
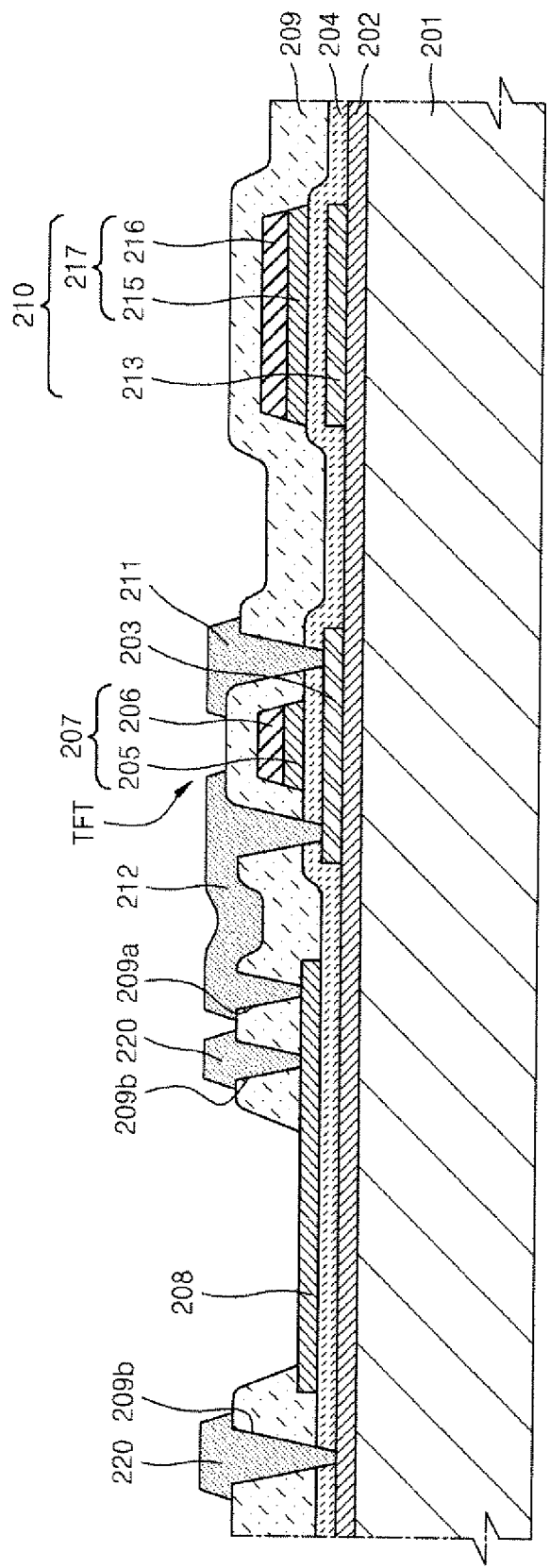

Then, referring to FIG. 8C, the source electrode 211 and the drain electrode 212 are formed on the interlayer insulating layer 209 so as to obtain the TFT, and the reflective unit 220 is formed.

The source electrode 211 and the drain electrode 212 are connected to the source and drain regions, respectively, of the active layer 203. The drain electrode 212 is electrically connected to the first electrode 208. In detail, the drain electrode 212 is formed so as to correspond to the contact hole 209a and so as to contact an upper surface of the first electrode 208.

The reflective unit 220 corresponds to the through-hole 209b. The reflective unit 220 is simultaneously formed with the source electrode 211 and the drain electrode 212. That is, the reflective unit 220, the source electrode 211, and the drain electrode 212 are simultaneously formed by performing a single patterning process.

Figure 8D:
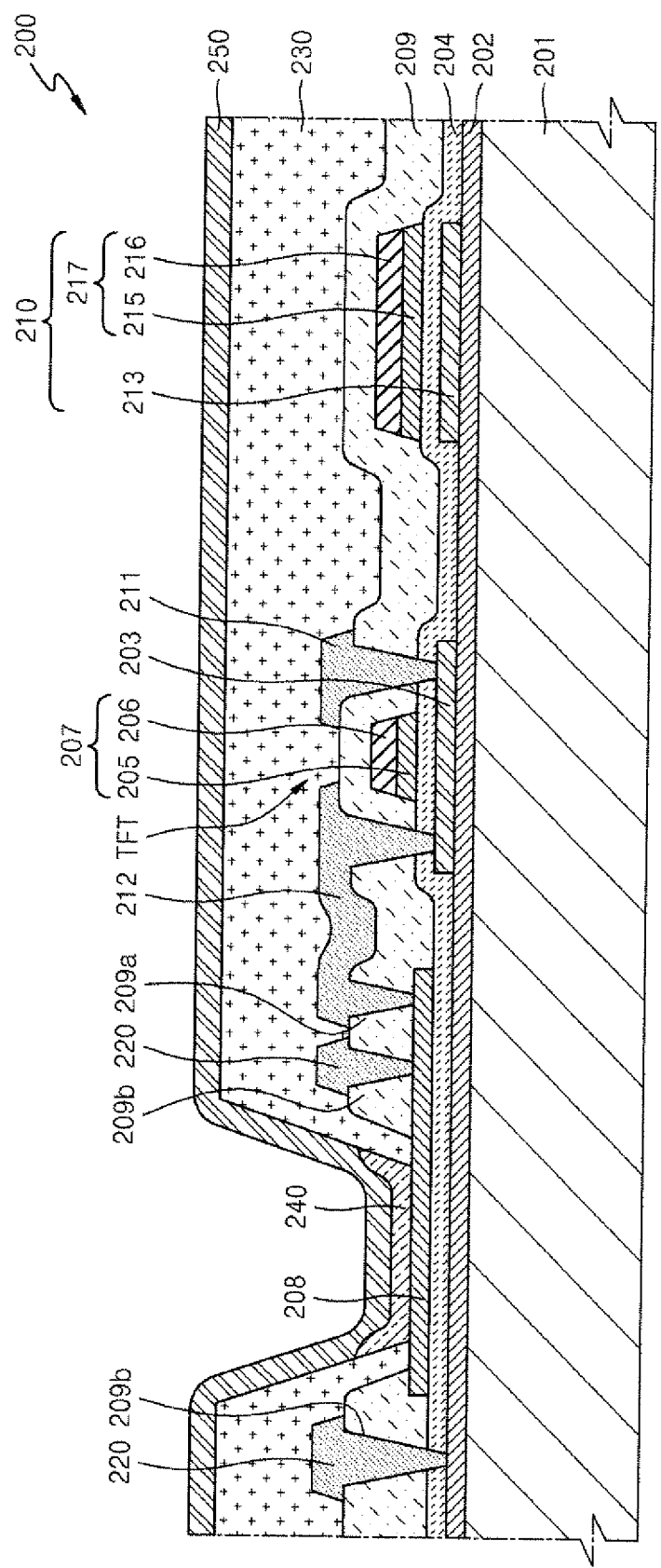

Then, referring to FIG. 8D, the intermediate layer 240 and the second electrode 250 are formed so as to obtain the organic light-emitting display apparatus 200.

Specifically, the pixel defining layer 230 is formed on the interlayer insulating layer 209 to cover the TFT and the capacitor 210. The pixel defining layer 230 exposes an upper region of the first electrode 208. The intermediate layer 240 is formed so as to contact the first electrode 208. The intermediate layer 240 includes an organic emission layer (not shown).

The second electrode 250 is formed on the intermediate layer 240. If voltage is applied to the first electrode 208 and the second electrode 250, visible light is emitted from the organic emission layer of the intermediate layer 240.

A sealing unit (not shown) may be disposed on the second electrode 250.

In the organic light-emitting display apparatus 200 according to the current embodiment, the reflective unit 220 is included, and the reflective unit 220 is simultaneously formed with the source electrode 211 and the drain electrode 212, thereby facilitating the manufacturing process, enhancing the optical efficiency of the organic light-emitting display apparatus 200, and improving image quality.

With an organic light-emitting display apparatus and a method of manufacturing the same according to the above embodiments, it is possible to easily improve image quality.

While this invention has been particularly shown and described with reference to exemplary embodiments thereof, it will be understood by those of ordinary skill in the art that various changes in form and detail may be made therein without departing from the spirit and scope of the invention as defined by the appended claims.

What is claimed is:

1. An organic light-emitting display apparatus, comprising:
   a substrate;
   a first electrode disposed on the substrate;
   an intermediate layer disposed on the first electrode and including an organic emission layer;
   a second electrode disposed on the intermediate layer; and
   a reflective unit disposed near the intermediate layer for reflecting visible light emitted from the intermediate layer.

2. The organic light-emitting display apparatus of claim 1, wherein the reflective unit is formed long so as to correspond to at least one side surface of the intermediate layer.

3. The organic light-emitting display apparatus of claim 1, wherein the reflective unit wraps around side surfaces of the intermediate layer.

4. The organic light-emitting display apparatus of claim 1, wherein a surface of the reflective unit facing the intermediate layer is inclined.

5. The organic light-emitting display apparatus of claim 1, wherein a surface of the reflective unit facing the intermediate layer forms an acute angle with the substrate.

6. The organic light-emitting display apparatus of claim 1, wherein the reflective unit is tapered from top to bottom.

7. The organic light-emitting display apparatus of claim 1, wherein the reflective unit is formed below a layer on which the first electrode is disposed.

8. The organic light-emitting display apparatus of claim 1, further comprising a thin-film transistor (TFT) disposed on the substrate, the TFT including an active layer, a gate electrode, a source electrode, and a drain electrode, and the TFT being electrically connected to the first electrode.

9. The organic light-emitting display apparatus of claim 8, wherein the reflective unit is formed of a same material used to form one of the source electrode and the drain electrode.

10. The organic light-emitting display apparatus of claim 8, wherein the reflective unit is disposed separate from the source electrode and the drain electrode.

11. The organic light-emitting display apparatus of claim 8, wherein one of the source electrode and the drain electrode is connected to the first electrode, and the reflective unit is connected to said one of the source electrode and the drain electrode which is connected to the first electrode.

12. The organic light-emitting display apparatus of claim 8, further comprising an interlayer insulating layer disposed between the gate electrode and the source electrode and between the gate electrode and the drain electrode;
wherein the interlayer insulating layer exposes a predetermined region of the first electrode, and the intermediate layer is disposed on the exposed region of the first electrode; and
wherein a through-hole is formed in the interlayer insulating layer, and the reflective unit is disposed in the through-hole.

13. The organic light-emitting display apparatus of claim 12, wherein a contact hole is formed in the interlayer insulating layer, one of the source electrode and the drain electrode is connected to the first electrode via the contact hole, and the through-hole is disposed separate from the contact hole.

14. The organic light-emitting display apparatus of claim 12, wherein the interlayer insulating layer includes a contact hole;
wherein one of the source electrode and the drain electrode is connected to the first electrode via the contact hole; and
wherein the through-hole is connected to the contact hole.

15. The organic light-emitting display apparatus of claim 8, wherein the gate electrode and the first electrode are disposed on a same layer.

16. The organic light-emitting display apparatus of claim 8, wherein the gate electrode comprises:
a first conductive layer; and
a second conductive layer disposed on the first conductive layer;
wherein the first electrode is formed of a same material used to form the first conductive layer.

17. The organic light-emitting display apparatus of claim 16, wherein the first conductive layer comprises a transmissive conductive material.

18. The organic light-emitting display apparatus of claim 16, further comprising a conductive unit disposed on a predetermined region of the first electrode;
wherein the conductive unit is connected to one of the source electrode and the drain electrode, and is formed of a same material used to form the second conductive layer.

19. A method of manufacturing an organic light-emitting display apparatus, the method comprising the steps of:
forming a first electrode on a substrate;
forming an intermediate layer on the first electrode, the intermediate layer including an organic emission layer;
forming a second electrode on the intermediate layer; and
forming a reflective unit near the intermediate layer for reflecting visible light emitted from the intermediate layer.

20. The method of claim 19, wherein the reflective unit, the source electrode, and the drain electrode are simultaneously formed of a same material.

21. The method of claim 19, further comprising the step of forming a thin-film transistor (TFT) on the substrate, the TFT being electrically connected to the first electrode and including an active layer, a gate electrode, a source electrode, and a drain electrode.

22. The method of claim 21, wherein the gate electrode comprises:
a first conductive layer; and
a second conductive layer disposed on the first conductive layer;
wherein the first electrode is formed of a same material used to form the first conductive layer;
wherein a conductive unit is formed on the first electrode so as to be connected to the drain electrode, and the conductive unit is formed by using a same material used to form the second conductive layer;
wherein the source electrode, the drain electrode, and the reflective unit are simultaneously patterned; and
wherein a predetermined region of the conductive unit is removed so as to expose an upper surface of the first electrode while the source electrode, the drain electrode, and the reflective unit are patterned.

23. The method of claim 21, wherein the first electrode and the gate electrode are patterned using one mask.

24. The method of claim 23, wherein the gate electrode comprises:
a first conductive layer; and
a second conductive layer formed on the first conductive layer;
wherein the first electrode is formed of a same material used to form the first conductive layer; and
wherein the step of forming the gate electrode and the first electrode comprises:
sequentially applying a material for forming the first conductive layer and a material for forming the second conductive layer without performing a patterning process thereon; and
simultaneously patterning the gate electrode and the first electrode by using a halftone mask.

* * * * *